United States Patent [19]

McDonald

[11] Patent Number: 4,683,446

[45] Date of Patent: Jul. 28, 1987

[54] PRF COHERENT, PULSED OSCILLATOR APPARATUS

[75] Inventor: Thomas W. McDonald, San Juan Capistrano, Calif.

[73] Assignee: Cartwright Engineering, Inc., Anaheim, Calif.

[21] Appl. No.: 743,799

[22] Filed: Jun. 12, 1985

[51] Int. Cl.$^4$ .............................................. H03K 7/08
[52] U.S. Cl. ........................................ 331/47; 331/75; 331/77; 331/173; 331/117 R; 332/9 T; 342/201
[58] Field of Search ................... 343/17.1 R, 17.1 PF, 343/17.1 PW; 307/106; 331/47, 74, 75, 77, 87, 172, 173

[56] References Cited

U.S. PATENT DOCUMENTS 3,270,342  4/1960  Stemmer ......................... 343/17.1 R

FOREIGN PATENT DOCUMENTS 661263  4/1963  Canada ........................... 343/17.1 R Primary Examiner—Eugene R. LaRoche
Assistant Examiner—James C. Lee Attorney, Agent, or Firm—Allan R. Fowler

[57] ABSTRACT

Phase locked, pulsed oscillator apparatus, for example, for radar use, comprises a pulsed r.f. oscillator, a pulse repetition frequency (PRF) generator and a pulse shaping network. The PRF generator pulsed output signal of frequency, $f_1$, is reshaped by the pulse shaping network to provide to the input gate of the r.f. oscillator a train of triggering pulses each having a very fast rise time, $t_r$, which caues the triggering pulses to exhibit significant harmonic power near the r.f. oscillator's free running frequency, $f_{FR}$. The reshaped pulses provided by the pulse shaping network gate the r.f. oscillator on and off and cause coherency of the pulsed oscillator output signal relative to the PRF generator output signal. The reshaped pulse rise time, $t_r$, is preferably less than about 3–4, and more preferably is about two, times the oscillator output signal period, $1/f_{FR}$. The peak turn on voltage, $V_p$, of the reshaped pulses is preferably about twice the average voltage, $V_{avg}$, of such pulses. PRF generator frequency, $f_1$, may be modulated in a manner enabling the communication of information by the r.f. oscillator.

15 Claims, 3 Drawing Figures

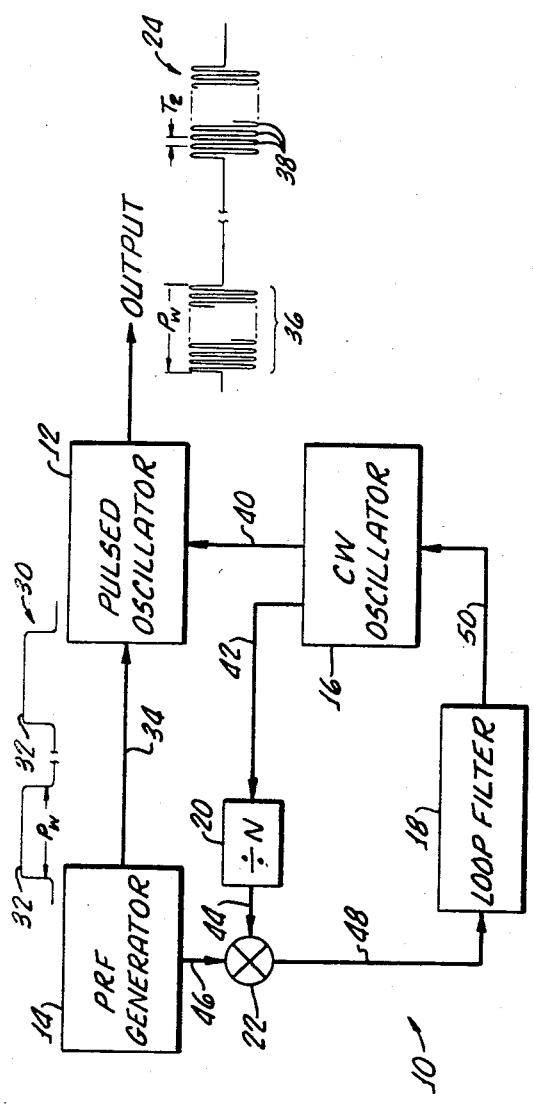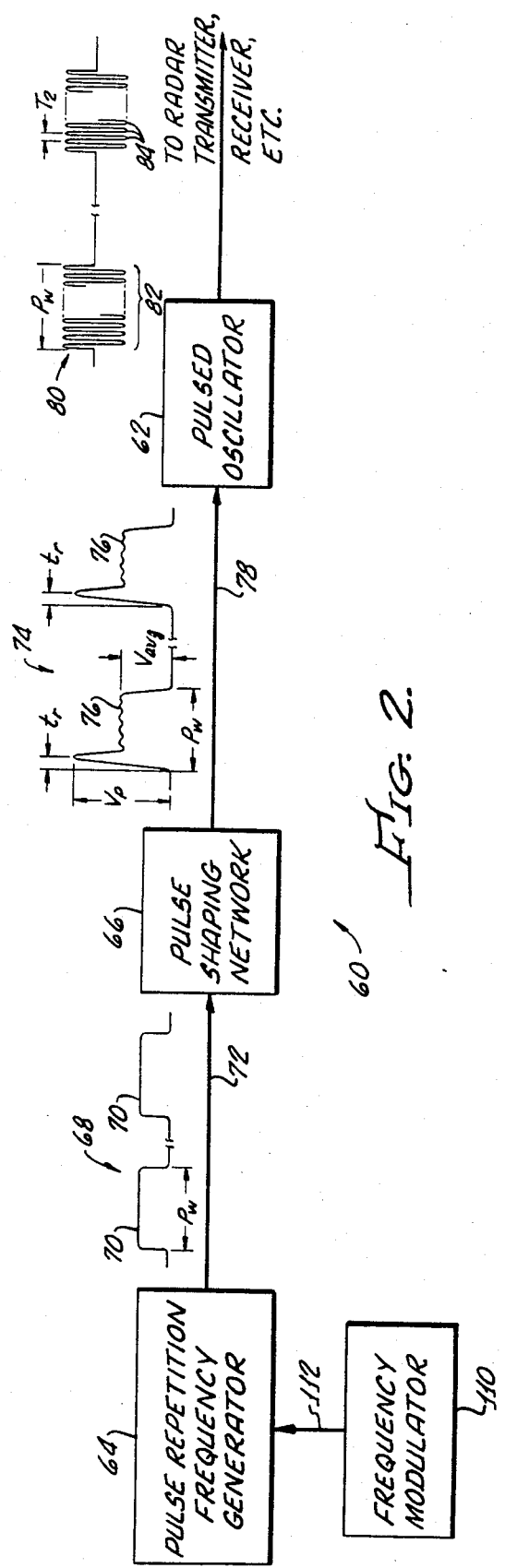

PRF COHERENT, PULSED OSCILLATOR APPARATUS

BACKGROUND OF THE INVENTION

1. Field of the Invention

The present invention relates generally to the field of pulsed oscillator apparatus and more particularly to phase-locked or PRF coherent, pulsed radio frequency oscillator apparatus as are commonly used in radar systems.

2. Discussion of the Prior Art

Radar systems, as is well known, have been extensively used in military and civilian applications since about World War II. Representative radar uses include the location and tracking of airborne aircraft and missles and of such natural phenomenae as tornados, hurricanes and storm fronts.

As is also well known, radar operates generally by the emission of electromagnetic waves, ordinarily produced by a radio frequency (r.f.) oscillator. These emitted waves are reflected towards the source by many types of objects, including those mentioned above. The reflected waves are received and compared with the transmitted waves with respect to wave phase and/or frequency, the differences being used to compute the location and velocity, if any, of the reflecting object relative to the radar transmitter. For ease in discrimination between transmitted and reflected waves, the r.f. oscillator of the radar transmitter is typically pulsed so as to provide a train of time separated pulses, each of which is, however, sufficiently long to include a number of the waves at the oscillator frequency.

Since information as to a detected object's location and velocity often depends upon minute differences between the transmitted and reflected waves or signals, it can readily be understood that the transmitted signal should be time-invariant in frequency and each pulse should be phase coherent. Accordingly, pulsed r.f. oscillators used in radar systems are commonly locked in phase to a precise, pulsed output of, for example, a crystal-type oscillator which may be a pulsed repetition frequency (PRF) generator.

In the past, such phase locking of the pulsed r.f. oscillators as are used in radar systems, has involved the use of relatively extensive, associated high frequency digital circuitry, which, for example, may cause the oscillator frequency to be an integral multiple of the PRF generator pulse frequency. As a result, such radar systems are not only comparatively costly, but also require relatively large amounts of power.

The need, however, exists in various important applications for small, relatively low cost and low power consuming radar apparatus. Typical of such applications is scoring apparatus for airborne, towed targets and/or pilotless drones used for gunnery practice. For applications such as these, the airborne scoring radar, which is configured for determining projectile miss distances within a pre-selected range, is subject to damage or destruction by target hits. Therefore, low cost of the scoring radar system is particularly desirable as is small size so as to lessen the probability of being hit by projectiles. Low power consumption of the radar system may also be an advantage for on-board scoring radar.

A need consequently exists in many instances for small, low cost radar systems and hence for small, low cost pulsed r.f. oscillator apparatus associated with such radars.

An object of the present invention is, therefore, to provide a pulsed r.f. oscillator, the output signal of which is coherent with respect to an associated PRF generator output signal, by reshaping the output pulse signal of the PRF generator and injecting the reshaped signal into the r.f. oscillator.

Another object of the present invention is to provide a PRF coherent, pulsed r.f. oscillator apparatus in which the output signal of a PRF generator is reshaped to provide an oscillator triggering signal that has substantial harmonic power near the free running frequency of the oscillator so that the reshaped signal controls the phase of the oscillator signal and also triggers the oscillator on and off.

Still another object of the present invention is to provide a PRF coherent, pulsed r.f. oscillator apparatus in which the pulsed output signal of a PRF generator is reshaped to provide an oscillator triggering signal which has a very fast rise time.

Yet another object of the present invention is to provide a PRF coherent, pulsed r.f. oscillator apparatus in which the pulsed output signal of a PRF generator is reshaped to provide an oscillator triggering signal which has a rise time which is no more than several times longer than the period of the pulsed oscillator signal.

Further objects, advantages and features of the present invention will become apparent to those skilled in the art from the following decription when taken in conjunction with the accompanying drawings.

SUMMARY OF THE INVENTION

PRF coherent, pulsed oscillator apparatus, according to an embodiment of the present invention, comprises a pulse repetition frequency (PRF) generator having pulse output signals of a frequency, $f_1$, with an associated period, $T_1$, equal to $1/f_1$, and a pulsed oscillator having a free running frequency, $f_{FR}$, which is approximately equal to N times the PRF generator output signal frequency, $f_1$, wherein N is an integer. Included in the apparatus are pulse shaping means connected for receiving the PRF generator output signals and for the shaping thereof into reshaped pulse signals having a preselected, sharp rise time, $t_r$, the pulse shaping means being connected to the pulsed oscillator, preferably to the base of a transistor input, for the providing of the reshaped pulsed signals thereto. The reshaped pulse rise time, $t_r$, is selected to impart significant harmonic power to the reshaped pulses near the free running frequency of the pulsed oscillator in combination with configuration of the pulsed oscillator for causing triggering on of the pulsed oscillator and for causing an output signal of the pulsed oscillator to have pulse-to-pulse consistency such that each output pulse bears the same relationship to the reshaped pulse as any other output pulse does.

The reshaped pulse signal rise time, $t_r$, is preferably less than about four times, and more preferably less than about twice, the length of the pulsed oscillator output signal period. In a particular embodiment, the pulsed oscillator output signal frequency, is about 3.245 GHz, the reshaped signal rise time is about 0.6 nsec, and the PRF generator output signal frequency is about 2.86 MHz.

Also, preferably, the reshaped pulse signal has a peak turn-on voltage, $V_p$, which is at least about twice as great as an average voltage, $v_{avg}$, of the reshaped pulse signal, the reshaped pulse signal peak turn-on voltage, $V_p$, being preferably equal to between about 0.2 and about 0.4 volts.

PRF generator output signal pulse width, Pw, and hence that of the reshaped signal, is selected to be substantially greater than the pulsed oscillator output signal period. According to an embodiment, the reshaped pulse signals have a pulse width, $P_w$, which is between about 50 and about 100 nsec for a pulsed oscillator output signal frequency of about 3.245 GHz.

Also, according to an embodiment of the invention, means may be provided for modulating the output signal of the PRF generator, and accordingly thereby modulating the output signal of the pulsed oscillator, in a manner encoding information into such output signals.

BRIEF DESCRIPTION OF THE DRAWINGS

A better understanding of the present invention may be had from a consideration of the following detailed description, taken in conjunction with the accompanying drawings in which:

FIG. 1 is an electrical block diagram of an exemplary, conventional phase-locked, pulsed oscillator apparatus shown for purposes of comparison with the phase-locked, pulsed oscillator apparatus of the present invention;

FIG. 2 is an electrical block diagram of PRF coherent, pulsed oscillator apparatus according to the present invention.

DESCRIPTION OF THE PREFERRED EMBODIMENT

Figure 3:
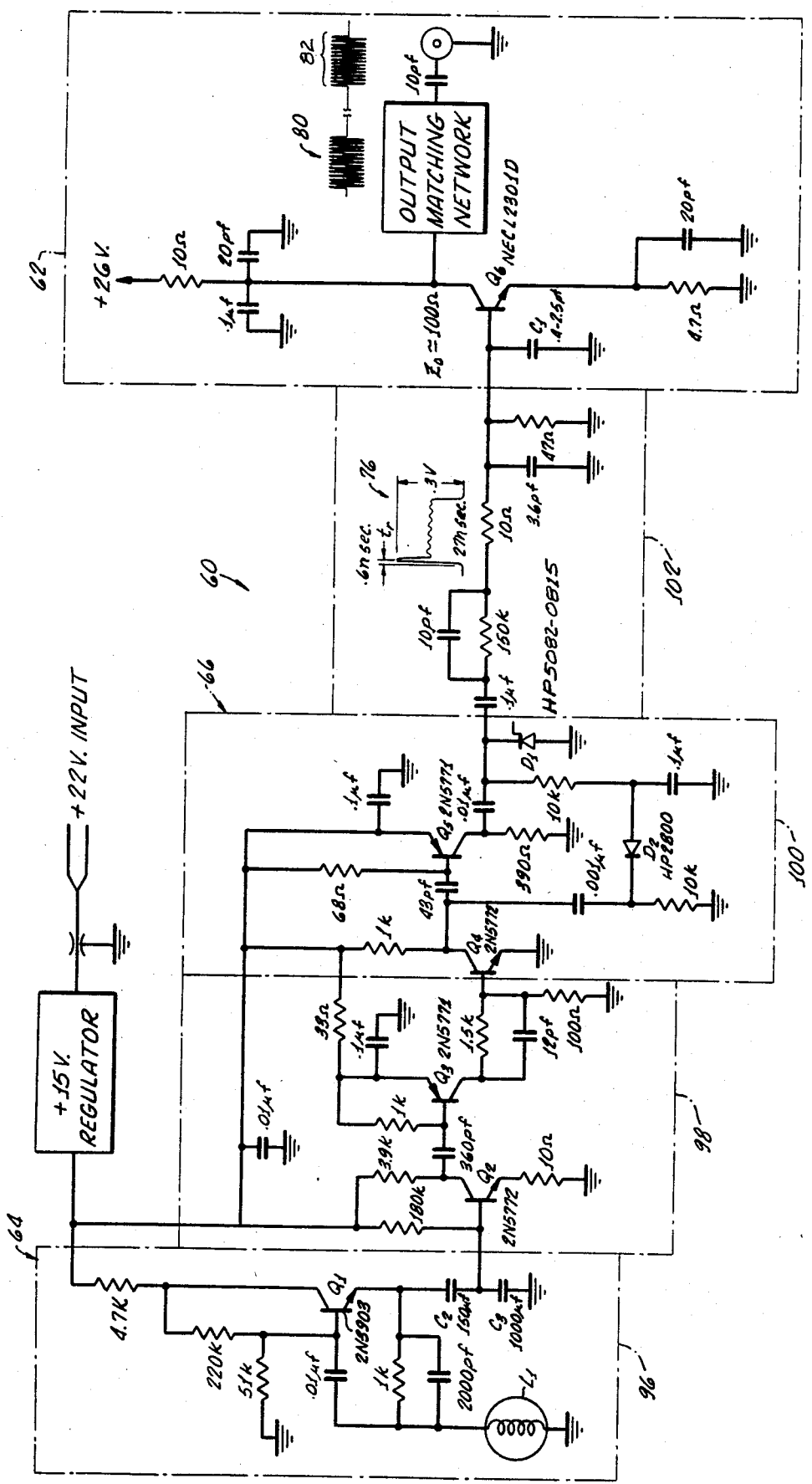
FIG. 3 is an electrical schematic drawing illustrating a manner in which the PRF coherent pulsed oscillator of FIG. 2 may advantageously be implemented.

The present invention may be better understood by a brief examination of an exemplary, known-type of phase-locked, pulsed r.f. oscillator apparatus 10 depicted, in block diagram form, in FIG. 1. Shown comprising oscillator apparatus 10 are a pulsed r.f. oscillator 12, a pulse repetition frequency (PRF) generator 14, a low power, continuous wave (c.w.) oscillator 16, a loop filter 18, a divide by N ($\div$N) circuit 20 and a mixer 22. A pulsed output signal 24 (more particularly described below) of r.f. oscillator 12 is provided, for example, to a radar transmitting antenna, not shown.

PRF generator 14, which may be, or include, a crystal controlled oscillator, provides a pulsed output signal 30 having a frequency, $f_1$, each of the pulses 32 provided thereby having the same pulse width, $P_w$. PRF generator output signal 30 is fed, through an electrical conduit 34, to a gating input of pulsed r.f. oscillator 12, such oscillator being gated on for a time equal to $P_w$ by each PRF generator pulse 32. As a result, output signal 24 of pulsed r.f. oscillator 12 comprises a series of pulses 36, each of which have a pulse width, $P_w$.

Pulsed r.f. oscillator 12 has a natural or free-running frequency, $f_{FR}$, which is selected by oscillator design or adjustment to be approximately equal to an integral number, N, times PRF generator output frequency, $f_1$. However, as above-mentioned, the free running frequency, $f_{FR}$, tends to drift with time, for example, due to heating of oscillator 12. On the other hand, for proper radar operation it may be desired that pulsed r.f. oscillator 12 have an output frequency, $f_2$, which is the integer N times PRF generator frequency, $f_1$; that is, that $f_2$ be coherent relative to $f_1$.

Since oscillator output frequency, $f_2$ is normally much greater than PRF generator output frequency, $f_1$, (since $f_2 = Nf_1$), output signal 24 of oscillator 12 comprises the sequence of pulses 36, each having a pulse width equal to $P_w$, during which the oscillator provides a signal 38 having a frequency, $f_2$.

Coherency of r.f. oscillator output signal, $f_2$, with respect to PRF generator frequency, $f_1$, as well as phase locking of oscillator output signal 38 so that each pulse 36 starts with the same phase of signal 38, is provided by c.w. oscillator 16, $\div$N circuit 20, mixer 22, and loop filter 18. To this end, an output of c.w. oscillator 16 is connected to an input of r.f. oscillator 12 by a conduit 40. The output of c.w. oscillator 20 is connected, by a conduit 42 to $\div$N circuit 20, the output of the latter being provided to mixer 22 through a conduit 44. Also provided to mixer 22, through a conduit 46 is the output of PRF generator 14. Connected between mixer 22 and c.w. oscillator 16, by conduits 48 and 50 is loop filter 18, the loop filter being connected, by conduit 50, to a VCU input of the c.w. oscillator. Within mixer 22 output signal 30 of PRF generator 14, at frequency, $f_1$, is mixed with the divided by N output signal frequency of c.w. oscillator 16 and any phase difference between the two signals results, through loop filter 18, in a signal to c.w. oscillator 16 causing its frequency to increase or decrease so as to be N times $f_1$.

It has, of course, been known that PRF generator signal 30 cannot, by itself, be used to trigger and phase lock pulsed oscillator 12 and to cause output signal frequency, $f_2$, of the r.f. oscillator to be coherent with signal frequency, $f_1$, of the PRF generator. Thus, the relatively complex, exemplary circuitry illustrated in FIG. 1, and described above, has been developed for such purposes.

However, it has now been discovered by the present inventor that the pulsed output signal of a PRF generator (corresponding to PRF generator 14) can be reshaped to provide triggering of an associated pulsed r.f. oscillator (corresponding to r.f. oscillator 12) in a manner providing coherency between the pulsed oscillator output signal and the output signal of the PRF generator.

To this end, a greatly simplified PRF coherent pulsed r.f. oscillator apparatus 60, according to the present invention, is depicted, in block diagram form, in FIG. 2. Generally comprising oscillator apparatus 60 are a pulsed r.f. oscillator 62, a PRF generator 64 and a pulse shaping network 66.

In the manner above-described for PRF generator 14, PRF generator 64 outputs a signal 68, comprising a series of pulses 70 of frequency, $f_1$, and pulse width, $P_w$. PRF generator frequency $f_1$, may, by way of descriptive example, be about 2.86 MHz. Output signal 68 of PRF generator 64 is provided, by a conduit 72, to the input of pulse shaping network 64.

As more particularly described below, pulse shaping network 66 reshapes the PRF generator signal 68 so as to output a reshaped signal 74 comprised of reshaped pulses 76 having a frequency and pulse width, $P_w$, equal to those of PRF generator signal 68. Signal 74 from pulse shaping network 66 is fed, via a conduit 78, to the input of pulsed r.f. oscillator 62. In response to the received reshaped signal 74 from pulse shaping network 66, r.f. oscillator 62 outputs a signal 80 comprised of a train of time separated pulses 82 having the same frequency and about the same pulse width, $P_w$, as PRF generator signal 68. Each r.f. oscillator output pulse 82 is comprised of a number of oscillations or waves 84 having a frequency equal to the free running frequency, $f_{FR}$, of the oscillation, the number of such oscillations per pulse 82 being, of course, dependent upon the width, $P_w$, of such pulses.

The present inventor has found that if reshaped pulses 76, provided by pulse shaping network 66, have significant harmonic power near the free running frequency of r.f. oscillator 62, the output signal 80 of the r.f. oscillator will have pulse-to-pulse consistency; that is, each r.f. oscillator output pulse 82 will be identical to each other pulse 82 in phase and shape and any such pulse will bear the same relationship to the reshaped pulses 76 as does any other such pulse. Since r.f. oscillator output signal 80 comprises a sequence of identical or repetitive pulses 82 the Fourier spectrum elements of the output signal are multiples of PRF signal 68 frequency, and coherency is thus achieved between r.f. oscillator output signal pulses 82 and PRF generator output signal pulses 70. The fact that the Fourier spectrum elements of r.f. oscillator output signal 80 are multiples of PRF signal 69 does not, however, imply that the period of the r.f. oscillator waves 84 is necessarily a harmonic of PRF output signal pulses 70. That is, r.f. oscillator frequency, $f_{FR}$, does not necessarily equal an integral number N times PRF generator frequency, $f_1$.

The condition for reshaped pulses 76 having significant harmonic power near the r.f. oscillator's free running frequency, $f_{FR}$, is satisfied by the reshaped pulses having a very fast rise time, $t_r$, as well as having a high turn on voltage peak, $V_p$, consistent with not damaging the input of r.f. oscillator 62 to which the reshaped pulses are provided. Preferably the rise time, $t_r$ of reshaped pulse 76 is no more than about 3 to about 4 times the period of r.f. oscillator oscillations 84, and is preferably only about twice such period. For an exemplary r.f. oscillator frequency $f_{FR}$ of 3.245 GHz, the signal period is about 0.308 nsec; therefore, the rise time, $t_r$, of reshaped pulses 76 is preferably no more than about 0.924 to about 1.233 nsec and is more preferably only about 0.6 nsec. Also, preferably, the peak turn on voltage, $V_p$, is equal to at least about twice the average voltage, $V_{avg}$ of pulses 76. Since pulsed r.f. oscillator 62 is triggered on by the leading edge of reshaped pulses 76, the shape of the rest of each pulse 76 is not generally critical so long as the average voltage, $V_{vag}$, is sufficient to keep oscillator 62 turned on. The effect on r.f. oscillator 62 of the very fast rise (turn on) time, $t_r$, of reshaped pulses 76 is that when each such pulse 76 is received, the oscillator is turned on and starts outputting oscillations or waves 84, which are coherent with respect to PRF generator output signal 68.

Width, $P_w$, of PRF generator pulses 70, and hence of reshaped pulses 76, as above-described, determines width of oscillator output pulses 82, and therefore determines the number of oscillations or waves 84 per pulse 82. Pulse width $P_w$ of pulses 70 is, by design and configuration of PRF generator 64, made sufficiently long to provide a sufficient number of oscillations 84 per output pulse 82 to assure proper operation of the system of which apparatus 60 forms a part. Thus, for the exemplary case in which r.f. oscillator frequency, $f_{FR}$ is 3.245 GHz and the corresponding period is about 0.308 nsec, pulse width, $P_w$, may, for example, be selected to be between about 50 and about 100 nsec, although the present invention is not limited to any particular time range for $P_w$.

FIG. 3 illustrates one manner in which PRF coherent, pulsed r.f. oscillator apparatus 60 of the present invention may be electronically implemented. As shown in FIG. 3, PRF generator 64 has associated or formed therewith a generator portion 96 and a buffer portion 98; pulse shaping network 66 has associated or formed therewith a network portion 100 and an interface portion 102. Values of the various resistors and capacitors are as indicated in FIG. 3, and types of the various transistors and diodes are also indicated on such Figure. Inductance, $L_1$, may, for example comprise 73 turns of 30 enameled wire wound on a T50-6 core. Diode $D_1$ is preferably a step recovery diode.

As described above, by way of example, PRF generator 64 provides an output signal 68 having a frequency, $f_1$, equal to 2.86 MHz. Output signal pulses 76 from pulse shaping network 66 has a pulse rise time, $t_r$, equal to about 0.6 nsec, a pulse width, $P_w$, of about 27 nsec, a pulse fall time, $t_f$, of about 6.8 nsec and a peak turn on voltage, $v_p$, of about 0.3 V.

Variable capaciter, $C_1$, of pulsed oscillator 62 is varied to adjust the free running frequency, $f_{FR}$, of the pulsed oscillator to be about 3.245 GHz. The very fast rise times, $t_r$, of reshaped pulses 76 provide sufficient harmonic energy at the oscillator's free running frequency, $f_{FR}$, to cause oscillator 62 to start each pulse 82 at a fixed phase relationship with respect to reshaped pulse 76. Injection of the reshaped pules 76 directly into the base of pulsed oscillator transistor $Q_6$ not only gates oscillator 62 on and off, but is also very effective in achieving coherency of the pulsed oscillator output signal 80 to PRF generator output signal 68.

In some circumstances it may be desirable to also be able to use apparatus 60 to transmit data or information. For example, if apparatus 60 is used in an airborne target miss distance radar, it may be desirable to use the apparatus also to transmit information a to the determined miss distance to a ground scoring station. For such purposes, as shown in FIG. 2, modulating means 110 are connected to PRF generator 64 by a conduit 112. Modulating means 110, which may be of known conventional design, may, therefore, be used, for example, to frequency modulate PRF generator frequency, $f_1$, and hence also r.f. oscillator output signal pulses 82, in a manner encoding information or data into oscillator output signal 80.

Although there has been described above a specific arrangement of a PRF coherent, pulsed oscillator apparatus in accordance with the present invention for the purpose of illustating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. Phase-locked, pulsed oscillator apparatus which comprises:
   (a) a pulse repetition frequency (PRF) generator having pulse output signals of a frequency, $f_1$, with an associated period, $T_1$, equal to $1/f_1$;
   (b) a pulsed oscillator having a free running frequency, $f_{FR}$, which is approximately equal to N times the PRF generator output signal frequency, $f_1$, wherein N is an integer; and
   (c) pulse shaping means connected for receiving the PRF generator output signals and for shaping thereof into reshaped pulses having a sharp rise time, $t_r$, selected to impart significant harmonic power to the reshaped pulses near the free running frequency of the pulsed oscillator, said pulse shaping means being connected to the pulsed oscillator and providing said reshaped pulses thereto for causing triggering on of the pulsed oscillator, whereby the pulsed oscillator is caused to have pulse-to-pulse consistency such that each oscillator output pulse bears the same phase relationship to the reshaped pulses as does any other of said oscillator output pulses.

2. The pulsed oscillator apparatus as claimed in claim 1 wherein the reshaped pulse signal rise time, $t_r$, is less than about four times the length of the pulsed oscillator output signal period, $1/f_{FR}$.

3. The pulsed oscillator apparatus as claimed in claim 2 wherein the pulse signal rise time, $t_r$, is equal to about twice the length of the pulsed oscillator output signal period, $1/f_{FR}$.

4. The pulsed oscillator apparatus as claimed in claim 3 wherein the pulsed oscillator output signal frequency is about 3.245 GHz and the pulse signal rise time is about 0.6 n sec.

5. The pulsed oscillator apparatus as claimed in claim 1 wherein the PRF generator output signal frequency is about 2.86 MHz and the pulsed oscillator output frequency is about 3.245 GHz.

6. The pulsed oscillator as claimed in claim 1 wherein the reshaped pulse signal peak turn-on voltage, $V_p$, is equal to between about 0.2 and about 0.4 volts.

7. The pulsed oscillator as claimed in claim 1 wherein the pulse width, $P_w$, is equal to between about 20 and about 40 nsec.

8. The pulsed oscillator as claimed in claim 1 wherein the pulsed oscillator is constructed having a transistor into the base of which is fed reshaped pulse signals from the pulse reshaping means.

9. The pulsed oscillator apparatus as claimed in claim 1 including means for modulating the output signal of the PRF oscillator in a manner enabling the encoding of information therein, the output signal of the pulsed oscillator being correspondingly modulated so that said encoded information is transmitted thereby.

10. Phase-locked, pulsed oscillator apparatus which comprises:

(a) a pulse repetition frequency (PRF) generator having pulse output signals of a frequency, $f_1$, with an associated period, $T_1$, equal to $1/f_1$;

(b) a pulsed oscillator having a free running frequency, $f_{FR}$, which is approximately equal to N times the PRF generator output signal frequency, $f_1$, wherein N is an integer; and (c) pulse shaping means connected for receiving the PRF generator output signals and for the shaping thereof into reshaped pulses having a sharp rise time, $t_r$, selected to impart significant harmonic power to the reshaped pulses near the free running frequency of the pulsed oscillator, said pulse shaping means being connected to the pulsed oscillator and providing said reshaped pulses thereto for causing triggering on of the pulsed oscillator, whereby the pulsed oscillator is caused to have pulse-to-pulse consistency such that each oscillator output pulse bears the same phase relationship to the reshaped pulses as does any other of said oscillator output pulses; the reshaped pulse signal having a peak turn on voltage, $V_p$, which is at least about twice as great an an average voltage, $V_{avg}$, of said reshaped pulse signal.

11. Phase-locked, pulsed oscillator apparatus which comprises:

(a) a pulse repetition frequency (PRF) generator having pulsed output signals of a frequency, $f_1$, with an associated period, $T_1$, equal to $1/f_1$;

(b) a pulsed oscillator having a free running frequency, $f_{FR}$, which is approximately equal to N times the PRF output signal frequency, $f_1$, wherein N is an integer; and (c) pulse shaping means connected for receiving the PRF generator output signals and for shaping thereof into reshaped pulses having a sharp rise time, $t_r$, which is selected to impart significant harmonic power to the reshaped pulses near the free running frequency of the pulsed oscillator, and which is less than about four times the length of the period, $1/f_{FR}$, said pulse shaping means being connected to the pulsed oscillator and providing said reshaped pulses thereto for causing triggering on of the pulsed oscillator, whereby the pulsed oscillator is caused to have pulse-to-pulse consistency such that each oscillator output pulse bears the same phase relationship to the reshaped pulses as does any other of said oscillator output pulses.

12. The pulsed oscillator apparatus as claimed in claim 11 wherein the PRF generator output frequency, $f_1$, is about 2.86 MHz, the pulsed oscillator output frequency, $f_{FR}$, is about 3.245 GHz and wherein the reshaped pulse rise time, $t_r$, is about 0.6 nsec.

13. The pulsed oscillator apparatus as claimed in claim 11 wherein the pulse shaping means is configured for causing the reshaped pulses to have a turn-on voltage spike, the voltage level of which is about twice as great as the average voltage of the reshaped pulses.

14. The pulsed oscillator apparatus as claimed in claim 11 wherein the pulsed oscillator is configured for being turned on at the beginning of each reshaped pulse and for being turned off at the end of each reshaped pulse. The pulse width of the pulsed oscillator output signal being thereby about equal to the pulse width, $P_w$, being selected to be substantially greater than the pulsed oscillator output signal period, $1/f_{FR}$.

15. The pulsed oscillator apparatus as claimed in claim 12 including means for modulating the output signal of the PRF oscillator in a manner enabling the encoding of information therein, the output signal of the pulsed oscillator being correspondingly modulated so that said encoded information is transmitted thereby.

* * * * *